(12) United States Patent
Jakob et al.

(10) Patent No.: US 9,165,907 B2
(45) Date of Patent: Oct. 20, 2015

(54) METHOD AND A SYSTEM FOR PRODUCING A SEMI-CONDUCTOR MODULE

(75) Inventors: Andreas Jakob, Starnberg (DE); Thomas Kaiser, Munich (DE)

(73) Assignee: Interposers GMBH, Munich (DE)

( * ) Notice: Subject to any disclaimer, the term of this patent is extended or adjusted under 35 U.S.C. 154(b) by 40 days.

(21) Appl. No.: 13/580,455

(22) PCT Filed: Feb. 22, 2011

(86) PCT No.: PCT/EP2011/000828
§ 371 (c)(1),
(2), (4) Date: Nov. 19, 2012

(87) PCT Pub. No.: WO2011/101170
PCT Pub. Date: Aug. 25, 2011

(65) Prior Publication Data
US 2013/0059402 A1    Mar. 7, 2013

(30) Foreign Application Priority Data

Feb. 22, 2010 (DE) .......................... 10 2010 008 789
Sep. 14, 2010 (DE) .......................... 10 2010 045 372

(51) Int. Cl.
*H01L 21/00* (2006.01)
*H01L 25/065* (2006.01)
*H01L 25/00* (2006.01)
(Continued)

(52) U.S. Cl.
CPC ............ *H01L 25/0657* (2013.01); *H01L 25/50* (2013.01); *H01L 21/4867* (2013.01); *H01L 23/538* (2013.01); *H01L 2224/48463* (2013.01); *H01L 2225/0651* (2013.01); *H01L 2225/06513* (2013.01); *H01L 2225/06527* (2013.01);
(Continued)

(58) Field of Classification Search
None
See application file for complete search history.

(56) References Cited

U.S. PATENT DOCUMENTS

| 5,367,764 A | 11/1994 | DiStefano et al. |
| 5,436,203 A * | 7/1995 | Lin ................................. 29/841 |

(Continued)

FOREIGN PATENT DOCUMENTS

| DE | 10 2006 032 730 | 3/2007 |
| EP | 1 622 435 | 2/2006 |

(Continued)

OTHER PUBLICATIONS

International Preliminary Report on Patentability corresponding to International Patent Application No. PCT/EP2011/000828 with English translation, completed Jun. 13, 2012.

(Continued)

*Primary Examiner* — Scott B Geyer
*Assistant Examiner* — Evren Seven
(74) *Attorney, Agent, or Firm* — Lathrop & Gage LLP

(57) ABSTRACT

In a method for producing a semi-conductor module (10) comprising at least two semi-conductor chips (12, 14) and an interposer (20) which has electrically conductive structures (28) connecting the semi-conductor chips (12, 14) to one another, the interposer (20) is printed directly onto a first (12) of the semi-conductor chips. When the interposer (20) is printed on, the electrically conductive structures (28) are produced by means of electrically conductive ink (68). The second semi-conductor chip (14) is mounted on the interposer (20) such that the two semi-conductor chips (12, 14) are arranged one above the other and that the interposer (20) forms an intermediate layer between the two semi-conductor chips (12, 14).

22 Claims, 6 Drawing Sheets

(51) Int. Cl.
*H01L 21/48* (2006.01)
*H01L 23/538* (2006.01)

(52) U.S. Cl.
CPC ............... *H01L2225/06568* (2013.01); *H01L 2225/06572* (2013.01); *H01L 2924/1461* (2013.01)

(56) References Cited

U.S. PATENT DOCUMENTS

| | | | |
|---|---|---|---|
| 6,509,582 B1* | 1/2003 | Bendall | 257/48 |
| 6,713,389 B2 | 3/2004 | Speakman | |
| 7,262,623 B1* | 8/2007 | Mark et al. | 324/762.02 |
| 7,981,327 B2* | 7/2011 | Sakaguchi et al. | 252/518.1 |
| 2004/0014309 A1* | 1/2004 | Nakanishi | 438/614 |
| 2004/0219713 A1 | 11/2004 | Lee | |
| 2006/0087029 A1 | 4/2006 | Imanaka et al. | |
| 2006/0131721 A1 | 6/2006 | Ito | |
| 2006/0220262 A1 | 10/2006 | Meyer et al. | |
| 2006/0270104 A1 | 11/2006 | Trovarelli et al. | |
| 2007/0132089 A1 | 6/2007 | Jiang et al. | |
| 2008/0052904 A1 | 3/2008 | Schneider et al. | |
| 2008/0061402 A1 | 3/2008 | Ishihara et al. | |
| 2008/0094793 A1 | 4/2008 | Sakurai et al. | |
| 2008/0296697 A1 | 12/2008 | Hsu et al. | |
| 2009/0236749 A1 | 9/2009 | Otremba et al. | |
| 2009/0263938 A1 | 10/2009 | Ino | |
| 2010/0140811 A1* | 6/2010 | Leal et al. | 257/777 |
| 2011/0217809 A1* | 9/2011 | Li et al. | 438/72 |
| 2011/0254049 A1 | 10/2011 | Shimizu et al. | |
| 2011/0290319 A1* | 12/2011 | Melcher et al. | 136/256 |
| 2012/0021562 A1 | 1/2012 | Ikeda | |

FOREIGN PATENT DOCUMENTS

| | | |
|---|---|---|
| EP | 2 026 254 | 2/2009 |
| JP | 2003-297977 | 10/2003 |
| JP | 2004221146 | 8/2004 |
| JP | 2005-093661 | 4/2005 |
| JP | 2005136187 | 5/2005 |
| JP | 2006179562 | 7/2006 |
| JP | 2006210758 | 8/2006 |
| JP | 2006210758 A | 8/2006 |
| JP | 2008508703 | 3/2008 |
| JP | 2008-218752 | 9/2008 |
| JP | 2009218470 | 9/2009 |
| JP | 2009218470 A | 9/2009 |
| JP | 2009218703 | 9/2009 |
| KR | 100872583 | 12/2008 |
| WO | WO 2006/027981 | 3/2006 |
| WO | WO 2008/114430 | 9/2008 |

OTHER PUBLICATIONS

International Search Report corresponding to International Patent Application No. PCT/EP2011/000828 with English translation, mailed May 13, 2011.

Optomec (downloaded Feb. 15, 2011) "Aerosol Jet Technology," Technical information sheet. http://www.optomec.com/site/technoloay_aj.

* cited by examiner

METHOD AND A SYSTEM FOR PRODUCING A SEMI-CONDUCTOR MODULE

CROSS-REFERENCE TO RELATED APPLICATIONS

This application is the U.S. National Stage of International Application No. PCT/EP2011/000828, filed Feb. 22, 2011, which claims the benefit of German Patent Applications DE 10 2010 008 789.0, filed Feb. 22, 2010, and DE 10 2010 045 372.2, filed Sep. 14, 2010, all of which are hereby incorporated by reference to the extent not inconsistent with the disclosure herewith.

BACKGROUND TO THE INVENTION

The invention relates to a semi-conductor module and to a method and a system for producing this type of semi-conductor module.

As mobile electronics become more and more significant, conventional printed circuit boards with active or passive components, such as semi-conductor chips, applied to them two-dimensionally are becoming less significant. The electric or electronic components are stacked three-dimensionally. The aim here is to stack as many chips as possible in the form of a "stack" within the height of an individual housing. This technology is supported by very thin wafers which are being produced to be better and better. If the material thicknesses of thinned wafers—and so also of the individual silicon sheets—came within the range of over 150 μm in the past, material thicknesses of below 50 μm are currently possible.

This development also corresponds to the legality known as Moore's law according to which the electronics in semiconductors are being constantly reduced in size. The production and stacking of these thin chips is a consequent development of these attempts to accommodate as many functions as possible over the smallest possible area within a single semiconductor module. If in the past many functions have been accommodated two-dimensionally on boards, attempts are now being made to accommodate as many of these chips as possible in the smallest possible volume—and so three-dimensionally. Therefore, the person skilled in the art speaks of 3-dimensional integration.

Until now these thin chips have been stacked and contacted with one another by means of the classical wire bond. Here a thin metallic wire is fitted between the individual contacts of the chips and so connect the chips to one another electrically. However, this form of wiring has proven to be very intricate and defective.

As a result silicone through-contacting, also called the TSV process, has gained in significance. Here the thin wafer is perforated by means of continuous microholes between the layers of an integrated circuit—a so-called via—which can be in the form of etched or drilled holes. These vias are filled metallically and so contacts from the front side to the rear side of the wafer and so also of the resulting chips are produced. The challenge now is to generate from the contacts of a bottom chip electrical contacting to the contacts of the rear side of a chip stacked on the latter. At the same time, however, the two chips must be isolated electrically from one another over the rest of the surface.

It can be understood from DRAM chips how this object is currently achieved. With DRAM chips there is the requirement to produce as much storage space as possible within a small volume. With some manufacturers a so-called interposer—as a wiring plane—is introduced between the components to be stacked. This is facilitated by the chips all having the same function and the same geometric design. By means of the design it is therefore possible for the contact surface of a chip lying at the bottom to be located in the precise position where the contact surface is also positioned on the rear side of the chip lying at the top. The respective counter piece of a contact is therefore always located exactly opposite, and this facilitates contacting.

A thinned wafer, which is through-contacted in the same way as the vias of the TSV process at the points provided and connects the contact surfaces of both chips to one another electrically, is also used here in many cases as an interposer. This thin wafer is then introduced between the bottom and the top wafer and guides the electric signals. For the purpose of better contactability a metallic elevation can also be applied here either on the contact surfaces of the bottom and/or on the rear side of the top wafer. Such elevations are also called "bumps" by the person skilled in the art. It is also possible, however, to apply these bumps to one or to both sides of the interposer. For the purpose of permanent contacting the bumps should in many cases fuse onto the respective opposite contact surface and produce a permanent metallic connection.

However, contacting by means of bumps is prone to error. The desired electric contactings are often only produced in insufficient quantity. Furthermore, the thermal contacting between the semi-conductor chips and the interposer is not optimal for most applications. The heat dissipation from the chips to the interposer can often not be guaranteed sufficiently by the bumps.

While it is relative easy according to the prior art to stack components of the same type and geometric design and to contact them with one another, this is very much harder with different components because the latter can not be configured for this, or only to an insufficient extent, as regards design. As the number of different chips within a stack increases, the latter also becomes increasingly heavier. Additional problems also occur here because contacts between two different chips have to be rewired and lines may also cross here.

By means of an interposer according to the prior art this can be partially resolved by conductor paths being applied to both sides of this thin wafer, thus allowing relatively flexible contacts to be displaced geometrically. This method is very complex, however, and requires corresponding lithographic methods and so mostly also expensive masks. Therefore, it can not be adapted very easily and with an increasing number of chips stacked one above the other becomes very expensive. Due to the high mask costs the method can generally only be considered for semi-conductor modules which are produced in large numbers.

Furthermore, it is a problem that whole wafers always have to be stacked here. Only after the wafers have been stacked are the latter diced by sawing in order to obtain the individual semi-conductor modules. This makes it difficult to stack at the very least chips of different types and sizes. One must anticipate considerable wastage here, and this raises the cost of each functioning semi-conductor module.

Due to the current necessity for stacking on a wafer plane, the shape and size of the chips to be stacked is currently designed exactly uniform. Otherwise separation, for example by means of sawing, would no longer be possible because at least one chip would no longer correspond to the sawing model here.

Moreover, problems arise from the fact that in the production of wafers the chips located over the latter do not all have the desired properties and totally fail here or only have limited functionality. Therefore the yield on one wafer is now very rarely 100%. If one now stacks two wafers, the yield of which is respectively below 100%, it is more or less inevitable that a good chip will be placed here over or beneath a bad chip. In this way the yield of good semiconductor modules is affected very negatively.

UNDERLYING OBJECT

It is an object of the invention to provide a method and a system for producing a semi-conductor module with which the aforementioned problems are resolved, and in particular a semi-conductor module can be produced efficiently and inexpensively. Efficient and inexpensive production should be possible in particular for semi-conductor modules which are produced in comparably small numbers.

SOLUTION ACCORDING TO THE INVENTION

The aforementioned object can be achieved according to the invention by a method of producing a semi-conductor module comprising at least two semi-conductor chips and an interposer. The interposer has electrically conductive structures connecting the semi-conductor chips to one another. In the method according to the invention the interposer is printed directly onto a first of the semi-conductor chips. When the interposer is printed on, the electrically conductive structures are produced by means of electrically conductive ink. Moreover, the second semi-conductor chip is mounted on the interposer such that the two semi-conductor chips are arranged one above the other and that the interposer forms an intermediate layer between the two semi-conductor chips.

A semi-conductor chip in accordance with the application is to be understood as meaning an electronic circuit which is formed by means of a semi-conductor material, such as e.g. silicon or gallium arsenide. For example, this type of semi-conductor chip includes pn-junctions. In contrast, printed circuit boards contained in semi-conductor modules often do not form semi-conductor chips in accordance with the application. Such circuit boards produce electrical connections to the semi-conductor chips and have substantially larger structure sizes than the corresponding semi-conductor chips. An interposer according to the invention is to be understood as meaning a component which connects the semi-conductor chips to one another in an electrically conductive manner. In the prior art components which produce a connection between a semi-conductor chip and a circuit board are often also called interposers. This type of interposer therefore differs from the functionality of the interposer according to the invention.

In accordance with the application electrically conductive ink is understood as meaning a material which in the liquid or paste-like state is applied to a surface to be printed and is then solidified, for example by laser irradiation or heating. The solidified material is electrically conductive. Examples of such electrically conductive inks include so-called nano inks which contain silver particles.

According to the invention the interposer is printed directly onto the first semi-conductor chip, i.e. onto the front side or rear side of the latter. Here the electrically conductive structures are produced by means of electrically conductive ink. Direct printing on is to be understood as meaning that the interposer is not first of all printed onto a carrier layer separate from the first semi-conductor chip which is then in turn applied to the first semi-conductor chip, but rather the interposer is printed directly onto the first semi-conductor chip. The surface of the first semi-conductor chip to be printed can be formed e.g. by a passivation layer. The printing of the interposer onto the first semi-conductor chip can take place e.g. by an electrically insulating layer first of all and then the electrically conductive structures being printed on. Alternatively, the electrically conductive structures can also be printed directly onto the first semi-conductor chip. By printing the interposer directly onto the semi-conductor chip in accordance with the invention, the chips no longer have to be respectively stacked as part of a wafer, but can already be separated before stacking. Therefore chips of any size can be stacked one above the other.

An interposer printed directly onto the chip surface or the respective rear side of the latter makes it possible for the respective chips to be handled and sorted individually after dicing the wafers. Therefore the chips can be stacked with other chips or also be separated out according to their properties.

By means of the print production of the interposer and the use of electrically conductive ink according to the invention it becomes possible to produce small volumes of 3-dimensionally integrated semi-conductor modules in a far more economical way. While it is necessary in the methods according to the prior art to use lithographic methods and so sets of masks are required, or it is necessary when using films as the carrier material of the interposer to adapt corresponding productions, the printed interposer according to the invention only requires the change of print application. If one calculates the costs per semi-conductor module in the methods according to the prior art, as the number of these modules decreases, the costs per module increase greatly. Due to the possibility of changing the configuration of the interposer for each print application, changes or adaptations can be made quickly and economically.

According to one embodiment of the invention the electrically conductive ink is discharged from a nozzle in order to produce the electrically conductive structures. In particular, the electrically conductive ink is sprayed by means of a nozzle onto the surface to be coated. Here a method such as ink jet printing can be used wherein the ink is applied by means of small drops. According to one version according to the invention the electrically conductive structures are produced by means of an aerosol jet printing method. Particularly advantageous, however, is the aerosol jet printing method in the embodiment offered by the company Optomec. Here the material to be printed on is applied by a nozzle with a continuous jet. According to an alternative embodiment the electrically conductive ink can be printed onto the surface to be coated by means of a screen printing method.

According to a further embodiment of the invention the printing of the interposer onto the first semi-conductor chip includes printing an electrically insulating layer with openings onto the semi-conductor chip and spraying the electrically conductive ink onto the electrically conductive layer by means of a nozzle. The electrically insulating layer can comprise organic and/or inorganic material and be enriched with fillers and/or additives. Preferably hardening of the electrically insulating layer takes place after printing by means of actinic radiation, chemical reaction, heat or drying. Openings are formed in the electrically insulating layer, for example by the applied material not being cross-linked at these points and being removed again selectively. According to one version according to the invention the insulating layer is applied such that it levels out or smoothes the topography of the chip surface.

According to a further embodiment of the invention the electrically insulating layer is printed onto the first semi-conductor chip by screen printing. According to further embodiments the insulting layer can also be applied by rotation coating, spray coating, dispensing and/or by means of a nozzle.

As already mentioned above, according to one embodiment of the invention, when the interposer is printed onto the first semi-conductor chip the electrically conductive ink is sprayed directly onto the first semi-conductor chip by means of a nozzle.

According to a further embodiment of the invention the electrically conductive ink comprises metallic particles with a maximum dimension of at most 20 nm. In other words, the metallic particles have a grain size of at most 20 nm, in particular of at most 10 nm or of at most 2 nm.

According to a further embodiment of the invention the electrically conductive ink comprises silver, gold and/or copper particles. According to a further embodiment the electrically conductive ink comprises metallic particles which connect to one another at a temperature of below 200° C., in particular of below 150° C., and in particular cross-link or sinter. For some time inks have been offered which can be hardened or sintered at these low temperatures. An example of this type of ink is the conductive nano ink BayInk® TPS made by the Bayer company and which is enriched with silver particles of nanometer size. The very small particle size allows such inks to be able to be sintered at well below 200° C. Experiments are known in which temperatures of approx. 140° C. already made sintering possible. With conductivity of 5000 S/m these materials are sufficiently conductive. Moreover, Bayer also offers a conductive ink BayInk® CNT which is enriched by means of nanotubes and has promising properties. Apart from inks containing silver, the use of inks which contain nanoparticles of other metals, such as for example copper, is also advantageous.

According to a further embodiment of the invention, the electrically conductive ink comprises metallic particles which connect to one another when irradiated with light having a wavelength of less than 600 nm, and in particular cross-link or sinter. Thus, short-wave cross-linking or sintering with light having a wavelength of e.g. 523 nm or 355 nm is possible.

According to a further embodiment of the invention, the first semi-conductor chip is part of a wafer when printing on the interposer. The wafer generally has a plurality of semi-conductor chips. In other words, the first semi-conductor chip is not yet separated when the interposer is printed on. Alternatively, it is also possible however to separate the first semi-conductor chip before printing on the interposer.

According to a further embodiment of the invention the wafer is tested with regard to faulty regions before the interposer is printed on, and upon the basis of the test result the layout of the electrically conductive structures to be printed on is configured avoiding the faulty regions. According to a further embodiment second semi-conductor chips also to be mounted on the interposer are tested with regard to faulty regions before the interposer is printed on, and this test result is used to determine the layout of the electrically conductive structures to be printed on. This preferably takes place by the electrically conductive structures wiring functioning regions of the chips stacked one above the other in the finished semi-conductor module with one another. Faulty regions are thereby avoided by the electrically conductive structures. Preferably, upon the basis of the test result, semi-conductor chips which are faulty such that they appear to be unusable are rejected in advance.

According to the invention a semi-conductor module is also provided comprising at least two semi-conductor chips arranged one above the other and an interposer disposed between the two semi-conductor chips. The interposer has electrically conductive structures connecting the semi-conductor chips to one another and is in the form of a print layer having at least a single layer and which is directly adjacent to a first of the semi-conductor chips, the electrically conductive structures being formed from electrically conductive ink. The electrically conductive ink is in a solidified or cross-linked or sintered state in the finished semi-conductor module. According to one embodiment of the semi-conductor module the electrically conductive ink is produced by discharging by means of a nozzle. Preferably, the electrically conductive ink comprises metallic particles having a maximum dimension of at most 20 nm.

According to the invention a semi-conductor module is also provided which comprises at least two semi-conductor chips arranged one above the other, and an interposer disposed between the two semi-conductor chips. The interposer comprises electrically conductive structures connecting the semi-conductor chips to one another, the electrically conductive structures having metallic particles with a maximum dimension of at most 20 nm, in particular having a maximum dimension of at most 10 nm or of at most 2 nm. These structures can be produced by means of a so-called nano ink. The small dimension of the metallic particles makes it possible to connect the particles of the ink at a relatively low temperature, i.e. to cross-link or to sinter the ink. According to one embodiment the electrically conductive structures have metallic particles which connect to one another at a temperature of below 150° C. Printing of the interposer directly onto one of the semi-conductor chips is thus substantially facilitated because by means of the relatively low cross-linking temperature the electrical properties of the semi-conductor chips are not affected negatively. According to a further embodiment of the invention the electrically conductive structures comprise silver, gold and/or copper particles. According to a further embodiment the electrically conductive structures comprise metallic particles which connect to one another, in particular cross-link or sinter, when irradiated with light having a wavelength of less than 600 nm.

Furthermore, according to the invention a system for producing a semi-conductor module having at least two semi-conductor chips and an interposer which has electrically conductive structures connecting the semi-conductor chips to one another is provided. The system comprises a printing device which is configured to print an interposer onto a first of the semi-conductor chips and to thereby produce the electrically conductive structures by means of electrically conductive ink. The system further comprises a mounting device which is configured to mount the second semi-conductor chip on the interposer such that the two semi-conductor chips are arranged one above the other and the interposer forms an intermediate layer between the two semi-conductor chips. The printing device and the mounting device can respectively be designed as separate apparatuses. Alternatively, this device can however also be modules of a single apparatus.

According to one embodiment of the system according to the invention the printing device comprises a first printing unit which is configured to print an electrically insulating layer onto the semi-conductor chip. Moreover, the system has a second printing unit which comprises a nozzle for spraying electrically conductive ink onto the insulating layer.

According to a further embodiment the apparatus according to the invention further comprises a holding device which is configured to hold the first semi-conductor chip and to align it before printing on the interposer.

The features specified with regard to the embodiments of the method according to the invention listed above can be applied correspondingly to the semi-conductor module according to the invention and to the system according to the invention. Conversely, the features specified with regard to the embodiments listed above of the semi-conductor module according to the invention and of the system according to the invention can be applied correspondingly to the method according to the invention and to the semi-conductor module according to the invention.

BRIEF DESCRIPTION OF THE DRAWINGS

The above and further advantageous features of the invention are illustrated in the following detailed description of exemplary embodiments according to the invention with reference to the attached diagrammatic drawings. These show as follows.

DETAILED DESCRIPTION OF EXEMPLARY EMBODIMENTS ACCORDING TO THE INVENTION

In the exemplary embodiments described below elements which are similar to one another functionally or structurally are provided as far as possible with the same or similar reference numbers. Therefore, in order to understand the features of the individual elements of a specific exemplary embodiment, reference is made to the description of other exemplary embodiments or to the general description of the invention.

Figure 1:
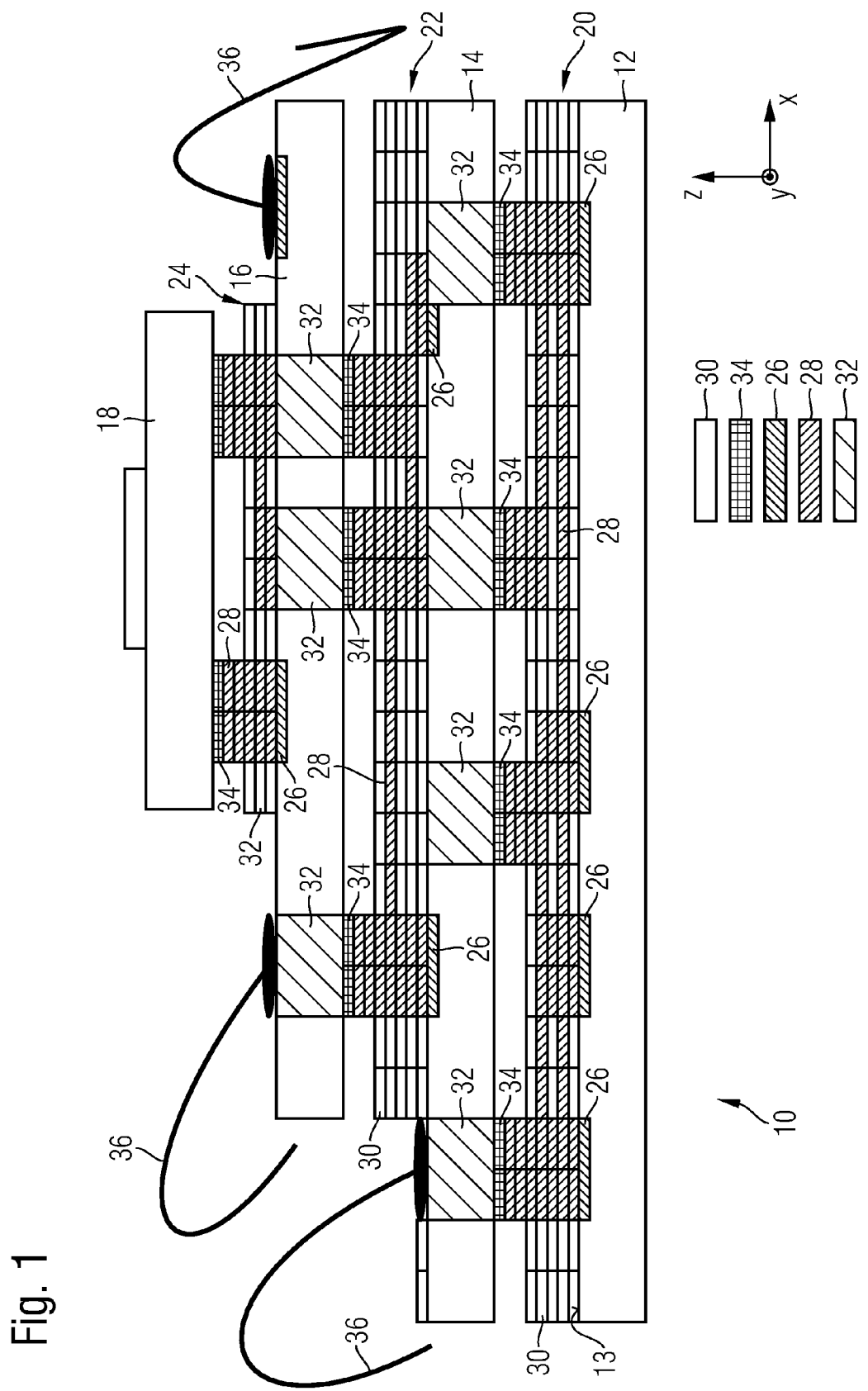
FIG. 1 a sectional view of a semi-conductor module according to the invention having four semi-conductor chips arranged one above the other and connected by means of interposers, FIG. 2 a sectional view of a first functional unit of a system according to the invention for producing a semi-conductor module, FIG. 3 a sectional view of a second functional unit of the system according to the invention for producing a semi-conductor module, FIG. 4 a sectional view of a third functional unit of the system according to the invention for producing a semi-conductor module, FIG. 5 a top view of the upper side of a semi-conductor chip having metallic contact surfaces, FIG. 6 the semi-conductor chip according to FIG. 5 having an electrically insulating layer printed onto the upper side of said chip, FIG. 7 the electrically insulating layer according to FIG. 6 having openings filled with electrically conductive ink, FIG. 8 the electrically insulating layer according to FIG. 7 having electrically conductive structures printed on said layer, FIG. 9 the structure according to FIG. 8 having a further electrically insulating layer embedding the electrically conductive structures, FIG. 10 the structure according to FIG. 9 having further electrically conductive structures applied to the surface of said structure, FIG. 11 the structure according to FIG. 10 having further applied electrically insulating layers and elevations formed by means of electrically conductive ink, and FIG. 12 the structure according to FIG. 11 having contact metal applied to the elevations.

In order to facilitate the description of the projection exposure tool a Cartesian xyz coordinate system is specified in the drawings from which the respective relative position of the components shown in the figures is clear. In FIG. 1 the y direction runs perpendicular to the plane of the drawing and away from the latter, the x direction to the right, and the z direction upwards.

FIG. 1 shows a diagrammatic illustration of a semi-conductor module 10 according to the invention in a sectional view. This is a three-dimensionally integrated module in which a number of—in this case four—semi-conductor chips 12, 14, 16 and 18 are stacked one above the other. So-called interposers 20, 22 and 24 are respectively disposed between the semi-conductor chips. The interposers connect the respective adjacent semi-conductor chips to one another electrically. The interposer 20 connects the semi-conductor chips 12 and 14, the interposer 22 connects the semi-conductor chips 14 and 16, and the interposer 24 connects the semi-conductor chips 16 and 18. In the example illustrated the semi-conductor chip 18 located right at the top of the stack is in the form of a sensor, whereas the semi-conductor chips 16, 14 and 12 located below include various integrated circuits.

The interposer 20 between the semi-conductor chips 12 and 14 has electrically conductive structures 28 which are embedded into an electrically insulating material 30. According to the invention, both the electrically insulating material 30 and the electrically conductive structures 28 are printed directly onto an upper side 13 of the semi-conductor chip 12, as described in detail below. The electrically conductive structures 28 are formed by means of electrically conductive ink and contact metallic contact surfaces 26 on the upper side 13 of the semi-conductor chip 12. On the upper side of the interposer 20 the electrically conductive structures 28 are provided at a number of points with elevations made of contact metal 34—so-called bumps. These bumps contact the second semi-conductor chip 14 from the lower side of the latter at metallically filled microholes in the form of so-called vias 32. The filled vias 32 pass through the whole thickness of the semi-conductor chip 14. The individual vias are respectively contacted on their upper side either with a bonding wire 36 or electrically conductive structures 28 of the interposer 22. The structure of the interposers 22 and 24 is similar to the structure of the interposer 20 that has just been described.

Figure 2:
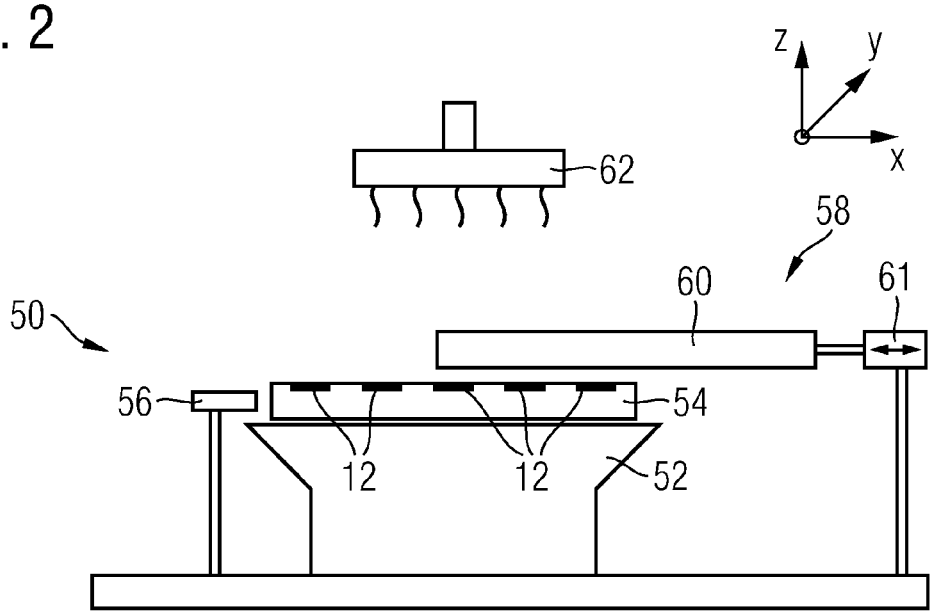
Figure 3:
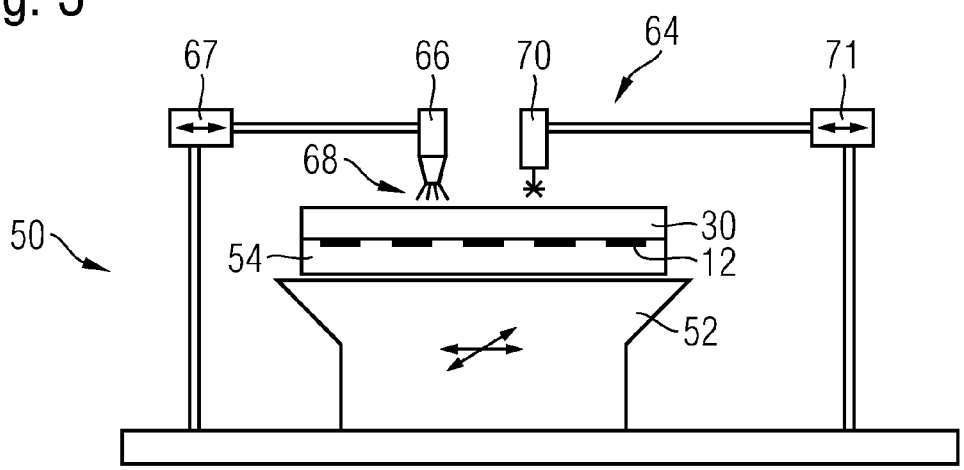
Figure 4:
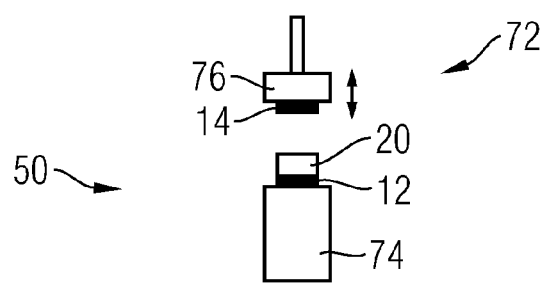

FIGS. 5 to 12 illustrate in detail the application of the interposer 20 to the upper side 13 of the semi-conductor chip 12 in an embodiment according to the invention. FIGS. 2 to 4 illustrate a system 50 used for this purpose for producing a semi-conductor module in an embodiment according to the invention. The system 10 according to the invention comprises a first printing unit 58 shown in FIG. 2, a second printing unit 64 shown in FIG. 3, and a mounting device 72 shown in FIG. 4. The aforementioned functional units can be partially or totally integrated into a single apparatus or also be designed respectively as separate units.

Figure 5:
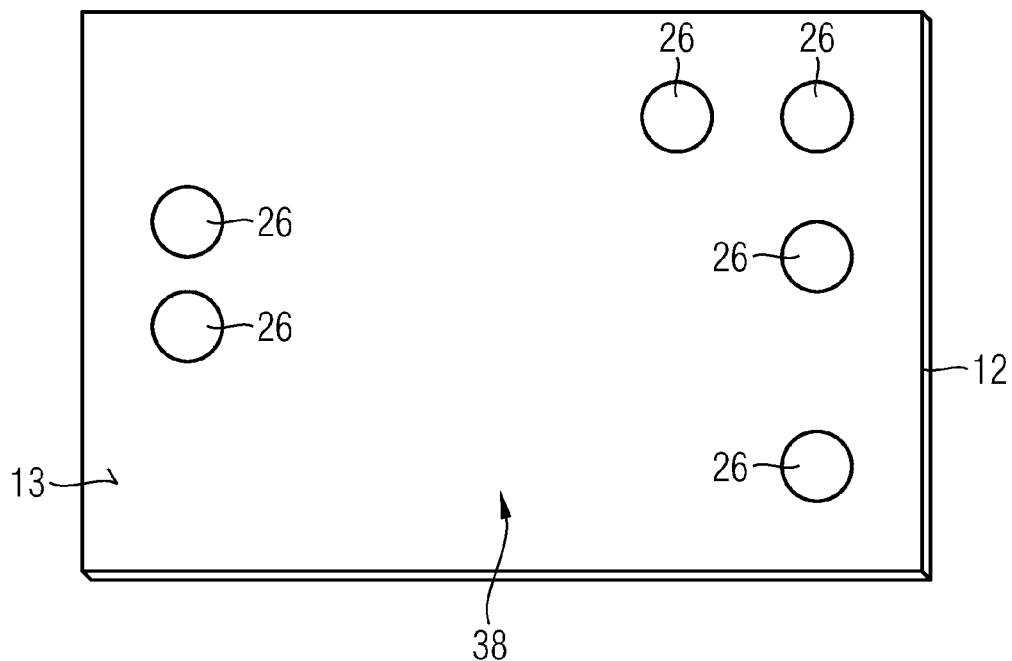
Figure 6:
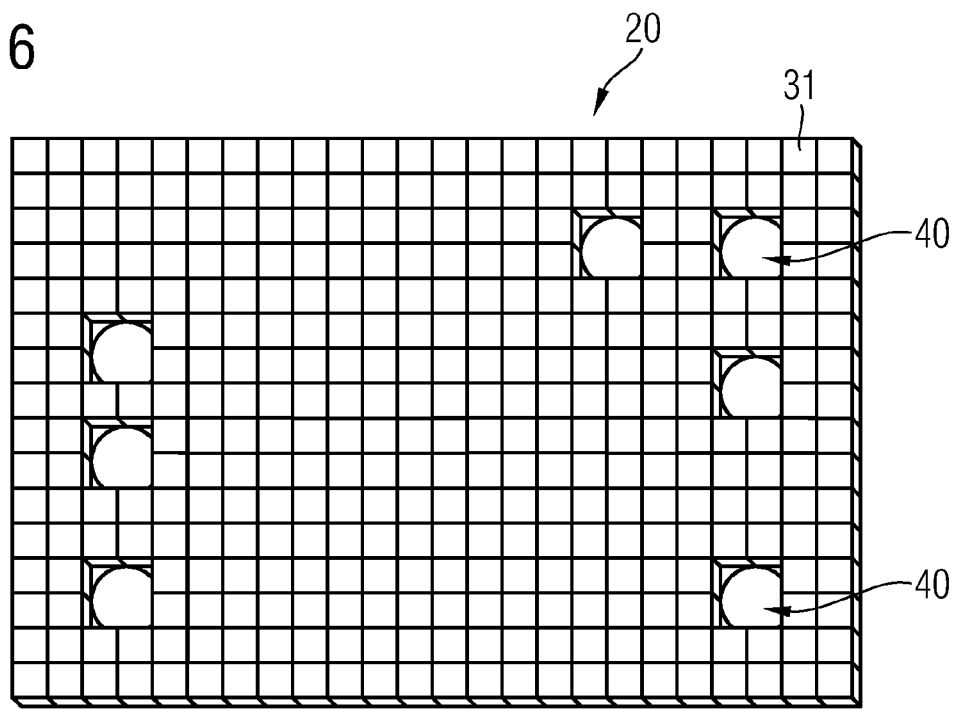

As shown in FIG. 2, the system 50 comprises a wafer holding device 52 for holding a wafer 54 which comprises a plurality of semi-conductor chips 12. According to the embodiment illustrated the semi-conductor chips 12 are processed without previous separation, i.e. as part of the wafer 54. The wafer 54 is first of all aligned by means of a wafer aligner 56 centrally on the wafer holding device 52. As shown in FIG. 5, the individual semi-conductor chips 12 have on their upper sides 13 a passivation layer 38 and a number of circular metallic contact surfaces 26 passing through the passivation layer 38.

In a first step of the production method in an embodiment according to the invention a layer 31 made of an electrically insulating material 30 is printed directly onto the upper side 13 of the semi-conductor chip 12, i.e. onto the passivation layer 38, in the form of a dielectricum using the screen printing method. The printing is implemented here such that the electrically insulating layer 31 has openings 40 in the region of the contact surfaces 26. In order to print on the layer 31, in the system 10 a print mask 60 illustrated in FIG. 2 is pushed over the wafer 54 by means of a displacing device 61. After the screen printing has taken place, the printed material is cross-linked by irradiating with UV light or heat. For this purpose the system 50 has an appropriate radiation source 62.

Figure 7:
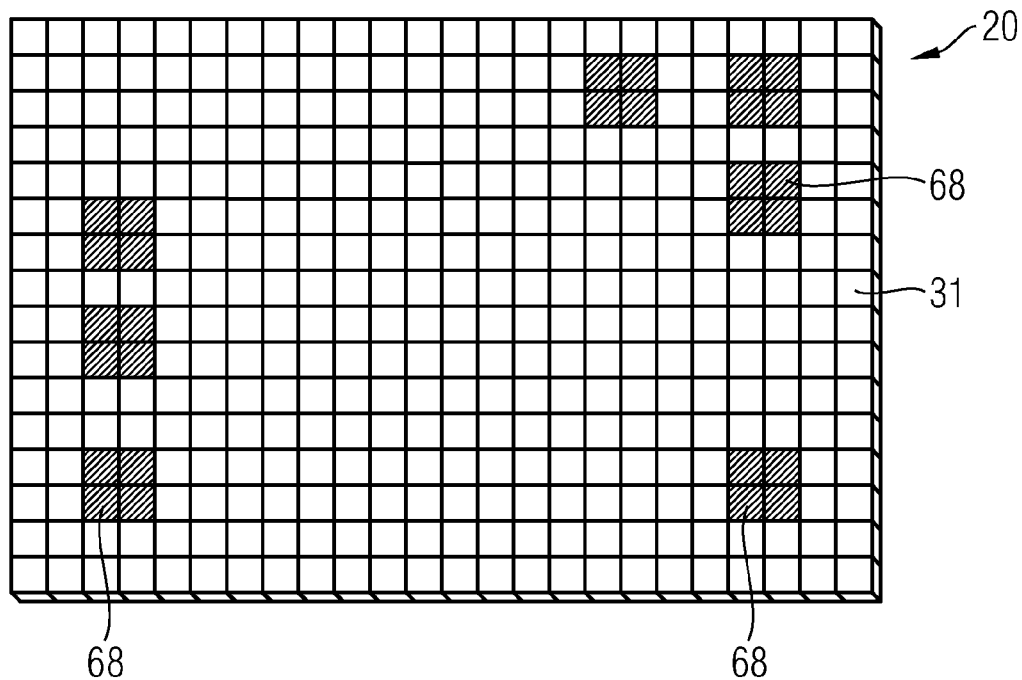
Figure 8:
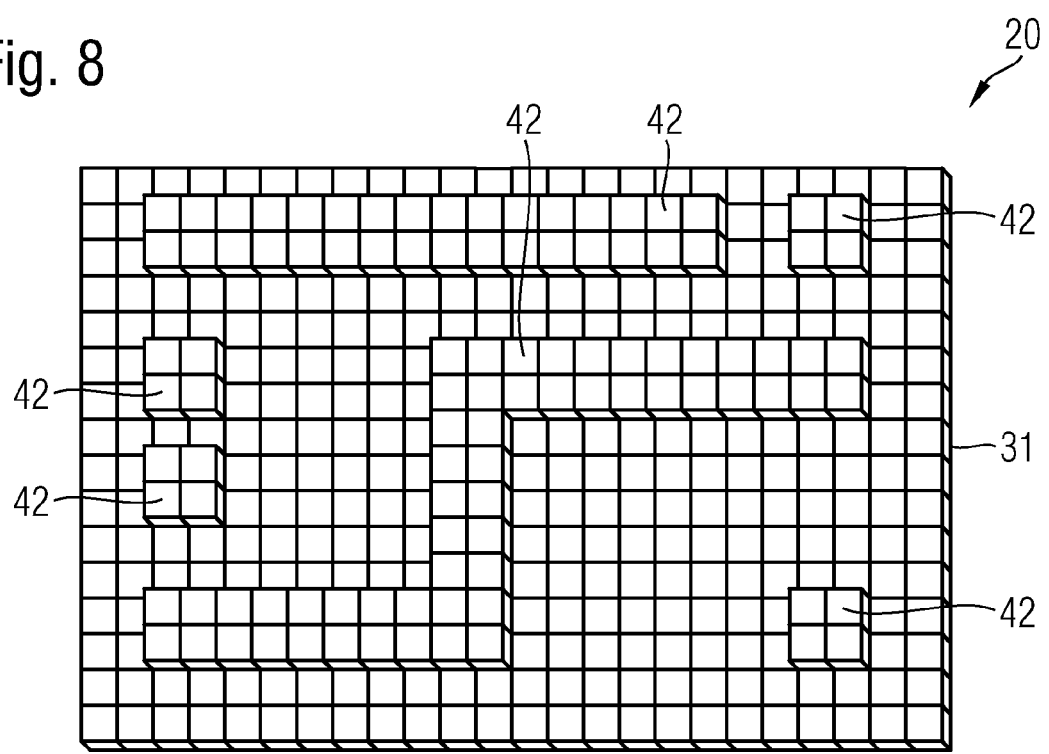

The openings 40 are then filled with conductive ink 68, as shown in FIG. 7. Furthermore, part of the conductor paths 42 forming electrically conductive structures 28 are printed onto the electrically insulating layer 31, as shown in FIG. 8. This is implemented by means of the second printing unit 64 shown in FIG. 3. This comprises a nozzle 66 for separating out the conductive ink 68, for example by means of an aerosol printing method. Here the conductive ink is applied to the insulating layer 31 by means of a continuous jet. The electrically conductive ink 68 can be configured differently, as stated in the general part of the description. According to one embodiment the ink 68 has silver particles of nanometer size. After applying the ink 68 the latter is irradiated with light from the laser 70 in order to cross-link or sinter the silver particles. Alternatively, the conductive ink 68 can also be applied to the insulating layer 31 by the screen printing method.

Figure 9:
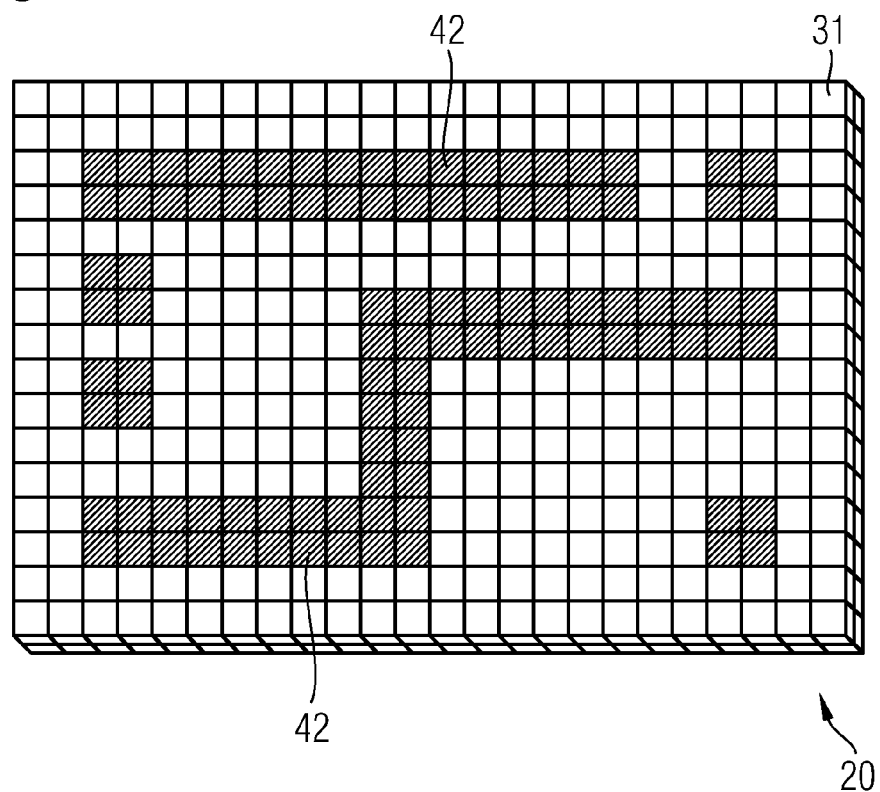
Figure 10:
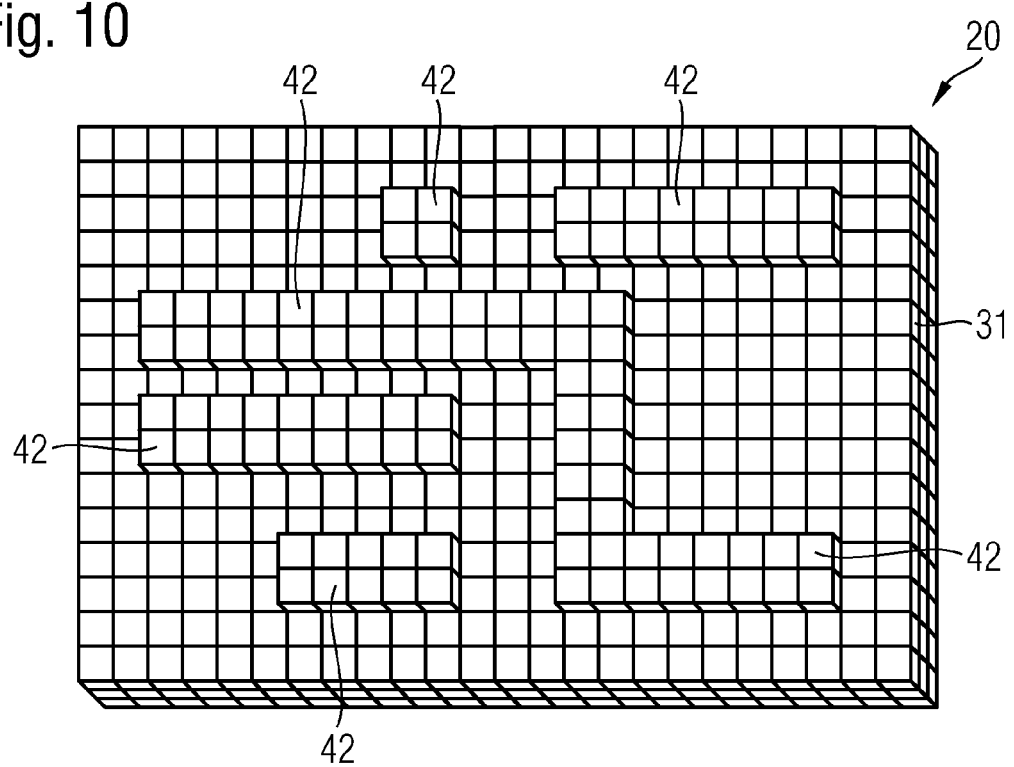
Figure 11:
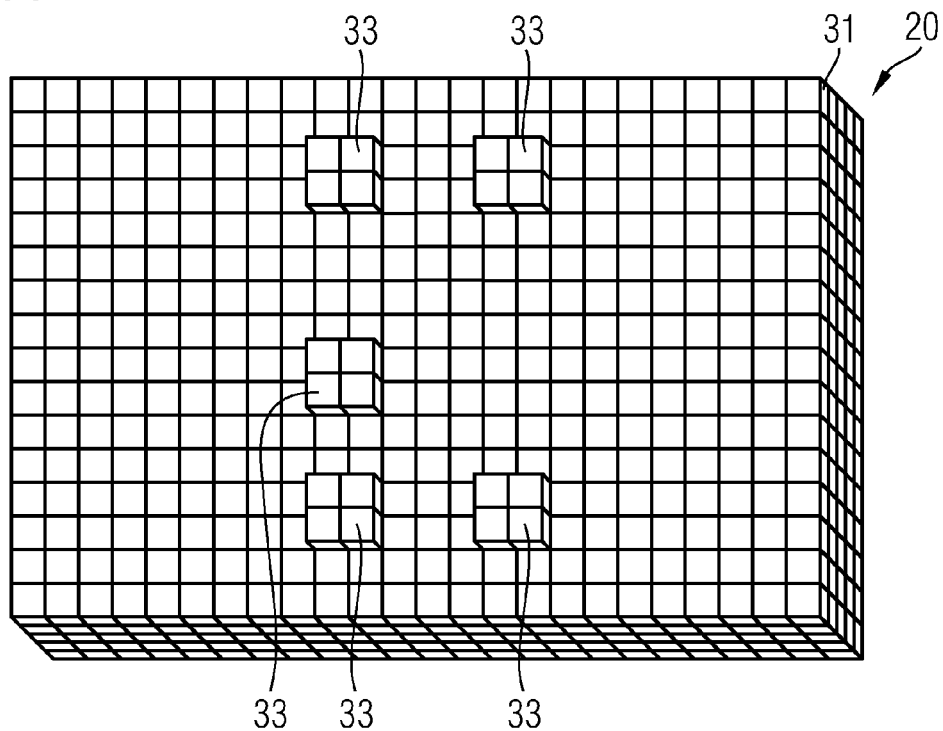

As shown in FIG. 9, the conductor paths 42 are then embedded in a further electrically insulating layer 31. Further printing processes follow in which further electrically insulating layers 31 and further conductor paths 42 are produced, as shown in FIGS. 10 and 11. As final production steps metallic elevations 33 are printed by means of conductive ink 68. The contact metal 34 is applied to these elevations in order to form the aforementioned bumps, as shown in FIG. 12.

Figure 12:
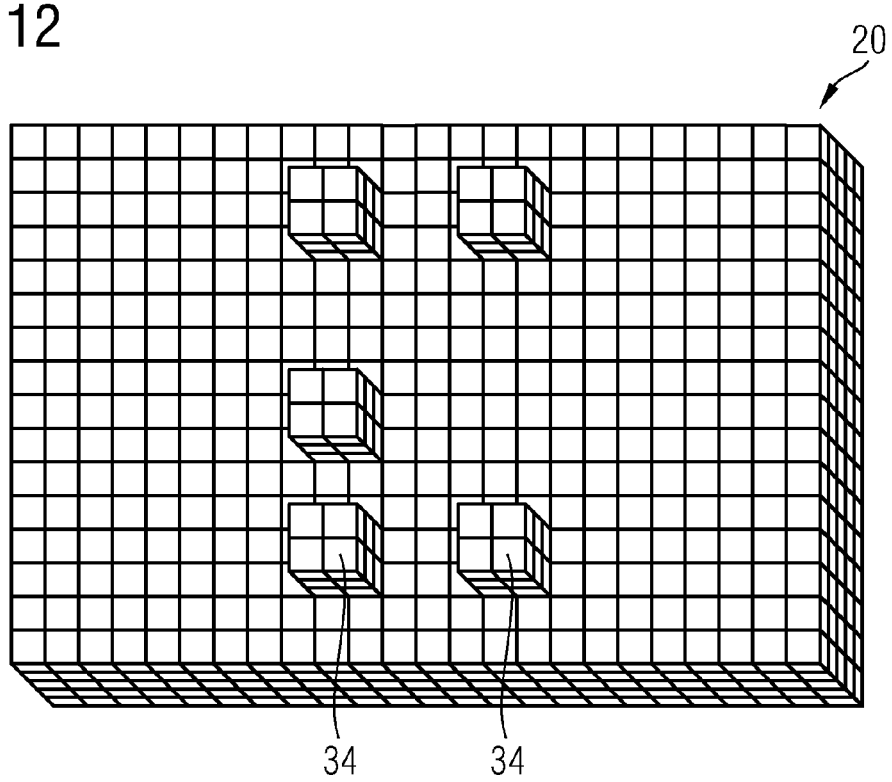

The further processing of the wafer 54 with the interposer 20 disposed on the latter from FIG. 12 can take place in different ways. According to a first embodiment the wafer 54 is now diced into the individual semi-conductor chips 12 by sawing. Next the semi-conductor chips 12 are arranged individually over a chip holding apparatus 74 according to FIG. 4, and the semi-conductor chip 14 is placed on the interposer 20 by means of a chip placing apparatus 76 in such a way that corresponding contact surfaces on the lower side of the chip 14 contact the contact metals 34 of the interposer 20. As a result the further interposers 22 and 24 and the further semi-conductor chips 16 and 18 are applied in the same way as in the method described above, and so the semi-conductor module 10 is completed.

In one embodiment according to the invention the individual semi-conductor chips 12, 14, 16 and 18 are tested with regard to their electrical properties before the three-dimensional integration of the semi-conductor module. The test result provides accurate information on faulty regions on the chips. The test results are used on the one hand in order to totally separate out faulty chips, and on the other hand in order to configure the layout of the electrically conductive structures 28 within the interposers 20, 22 and 24 in an appropriate way. This takes place such that faulty regions of the chips are excluded from the electrical contacting. Thus, for example, one can deviate from a line connection between two chip segments lying directly over one another if one of these segments is faulty, and in fact the line connection is guided to an adjacent segment of the faulty segment.

According to a further embodiment the wafer 54 with the interposer 20 printed onto it is not initially diced. Rather, a further wafer containing the chips 14 is placed on it so that the corresponding contact surfaces on the lower side of the chips 14 contact the contact metals 34 of the interposer 20. The printing of the interposer 22 then takes place over the entire surface of the wafer. The further chips 16 and 18 and the interposer 24 can then also be applied to the whole surface. Only then does dicing take place by sawing the wafer stack. In this case too the electrically conductive structures 28 are adapted to the electrical test results of the chips.

In the following further exemplary embodiments of the invention are described. Many of the exemplary embodiments describe embodiments illustrated above in different words, and other exemplary embodiments supplement or extend these.

The method according to the invention is intended to facilitate the stacking of electronic components (chips) into stacks in the 3D integration and contacting them electrically with one another. The method makes possible one or more wiring planes here which are called interposers. According to one embodiment here at least two different components are preferably applied by printing. Here one component takes on the function of a dielectric layer and the other component the function of an electric conductor. By selective control of a printer it is possible to design the interposer to print such that the contacts of two different chips can be contacted with one another flexibly and individually.

The following method largely dispenses with lithographic processes. It can be applied both to whole wafers and also to chips which have already been separated or to a combination of the latter.

Upon the basis of the surface of a completely processed chip which can still be in the composite of a non-diced wafer or which is already separated, this wafer or chip is now optically recognised and mechanically aligned in an apparatus. On the surface of the chip there are surfaces which are mostly protected with an appropriate layer for the purpose of the structures lying beneath—the person skilled in the art talks of these being passivated. Moreover, on the chip there are surfaces which are open for the purpose of subsequent contactability—the mostly metallic surface of which has deliberately not been isolated.

In the same apparatus which has aligned the wafer or the already separated chip there are according to one embodiment at least two print heads which can be controlled individually. However, these print heads can also be nozzles or other apparatuses which serve to apply material with low or high viscosity selectively and locally, such as for example screen printing devices.

The first print head is now set in operation. It now moves away from those regions which should continue to remain isolated and prints on a liquid. Depending on the application this liquid can be a polyamide, a lacquer, a resin or some other organic or inorganic material, and is enriched—if necessary—with additives or other appropriate admixtures in order to optimise them as regards their viscosity and/or their subsequent dielectric, mechanical and geometric properties. By means of an appropriate method this liquid is now cross-linked or hardened to form a layer which has dielectric properties. This method can consist of hardening the printed on material by means of energetic radiation in the form of light, e.g. a lamp or a laser. The person skilled in the art is familiar with methods wherein lacquers are cross-linked by means of UV light. By means of the prompt cross-linking, drying or other solidification or hardening of the printed on liquid the latter should be prevented from running undesirably. By controlling the print head appropriately, such as for example its forward speed, its printing frequency or printing quantity, it can also be used to level out or to smooth the topography of the surface of the chip—and so also that of a wafer. Indentations in the surface of the chips can thus be selectively filled.

Today's printing techniques allow a wide bandwidth of different viscosity, and so even pasty materials can be printed.

After the first print head has now printed on the liquid and has cross-linked, dried or solidified or hardened this appropriately in some other way, there remains a dielectric layer which has openings at points which are used for the purpose of contacting the chip or the wafer.

A second print head is now set in operation which prints a metallically enriched or filled liquid which is also called electrically conductive ink. This ink can also be enriched selectively with additives for the purpose of its viscosity and subsequent mechanical, electrical or topographical properties.

The printer with the metallic ink now selectively controls the surfaces which have not been printed with the dielectric material. By means of appropriate methods this ink is now treated so that it hardens and a good electrical connection with the metallic contact surfaces is reliably established. This can be a method which solidifies the ink by drying, for example in that solvent or water escapes. However, it is also possible to sinter or to fuse this ink by means of lasers or other appropriate energetic and/or thermal methods.

It is not absolutely necessary here for the geometric properties of the metal printed in this way to be similar to that of the applied dielectric layer. By selective control of the print head the print result can also be optimised by means of the print speed or the print head setting and be adapted so that the print result of both materials is supplemented geometrically.

According to one embodiment this first printed layer made of metal can also first of all be applied with another print head which prints a metallic ink which can contact and/or fuse better, by means of which the metallic connection to the contact surfaces is facilitated or improved, and only then printed with another metallic ink.

After a first metallic layer has been applied to the contacts of the wafer or the chip the print head prints on one or further layers which are appropriately dried, sintered, cross-linked or solidified or hardened in some other way. Moreover, it now also prints conductor paths which are used for the subsequent rewiring. The print head is moved here one or more times such that a conductor path is produced. As regards its geometric design, this conductor path will correspond to the width, height and cross-section of the set requirements. It is likewise with regard to the electrical properties, conductivity and ohmic resistance.

In the interplay between the two print heads one or more wiring planes can now be created. It can also be possible here for the two print heads, simultaneously or offset in time, to apply and cross-link or sinter their material to be printed.

By the interplay between the two print heads it is thus possible for the different wirings to be moved such that they cross and nevertheless are isolated from one another by the printed dielectric layer.

As a result a three-dimensional interposer is produced which is largely made of dielectric material and in which the electric wiring is contained.

Methods are known wherein electronic components which are mostly passive for printing such as electric resistors or capacities are printed. Within the layer composite such components can be printed by such a method. Here the conductor paths produced with the conductive material will contact these components. With the method it is therefore also possible to implement such components between two chips or also to supplement the electrical function of an individual chip by such a component being implemented between two contacts of a single chip.

For the purpose of the electrical contacting of the contacts on the rear side of the wafer or chip lying at the top it is possible by means of the print head to produce for the metallic ink a metal elevation which comes very close to the purpose and the form of a classic so-called "bump". For this purpose the print head prints multiple layers one over another until an appropriate elevation has been achieved which facilitates electrical contacting to the contacts on the rear side of the wafer or chip lying on top of the latter.

Moreover, it is possible for a third print head to print a second metallically filled ink onto the elevation which with regard to its thermal or other property facilitates contacting to the contact surfaces on the rear side. A metal coating is thus produced on the bump which would be able to fuse more easily.

One advantage of the invention is the fact that one can dispense with lithographic methods, and so masks which are expensive and complex to produce do not have to be used either. In particular when producing small series or in single unit production considerable cost advantages are to be anticipated in comparison to conventional methods. The fact that the printer control alone constructs the interposer is a particular advantage here because adaptation and implementation of the requirements is only based upon the changing of files in which the respective interposer scheme is stored.

It is a further advantage that components (chips) which have already been separated can be processed. Until now this was only possible very unsatisfactorily because until now the conventional lithographic methods were mostly only applicable to non-diced wafers.

Moreover, the flexible configuration of the interposer makes it possible to connect very many basic components (chips) of totally different size, geometric design and function to one another and to guarantee adaptable wiring within the resulting stack. A further advantage is that passive components can also be placed within the interposer.

A chip that has already been sawn from a wafer and so has been separated (semi-conductor component) should be stacked with a further separated chip and be electrically contacted. Both of these chips are components with different functions and different geometric designs. At least the chip at the top has been substantially thinned and for the purpose of electrical signal guiding has contacts on the rear side of the chip which by means of metallically filled holes (so-called vias) in the chip enable contacting from the front side of the chip to its rear side.

The chip lying at the bottom is aligned on the front side by means of optical recognition within a printing device. A print head now starts to apply a lacquer which is cross-linked within a second by means of a light beam with a high proportion of UV guided synchronously to the print head. By means of the light the previously applied lacquer is cross-linked here so that conversion to a solid material which has dielectric properties takes place.

By directing the print head and the synchronously guided light beam there is now produced on the component a layer with a dielectric property which has openings at previously determined points to which this layer is not applied. At these points are located contact surfaces of the chip which are kept free for the purpose of contacting.

Next a further print head applies a metallically filled liquid (metallically filled ink) selectively to those free points which have been previously omitted in the production of the dielectric layer and so have been kept free. A laser which this time cross-links or sinters the metallic filling of the liquid by means of its energy is directed synchronously here.

After the open contacts have been filled with the metallic ink, the print head is now controlled such that conductor paths are produced. By appropriately controlling both print heads an interposer is now constructed which guides the conductor paths contained within it such that the desired electrical contacting of both chips takes place. Here the conductor paths are embedded into the insulating material such that undesired contacting of the latter with one another or with the respective chips does not take place.

The invention includes the aspects described in the following clauses. These clauses form part of the description and are not claims.

Clause 1: A method wherein an interposer is produced by printing between stacked chips and/or wafers and microelectronic elements.

Clause 2: The method according to Clause 1 wherein this interposer is made of at least one insulating and/or one electrically conductive component.

Clause 3: The method according to either of the preceding clauses wherein the insulating layer is applied by printing.

Clause 4: The method according to any of the preceding clauses, wherein the insulating layer is applied by means of rotation coating, spray coating, dispensing and/or by means of a nozzle.

Clause 5: The method according to any of the preceding clauses, wherein the insulating layer is made of organic or inorganic material or a mixture of the latter.

Clause 6: The method according to any of the preceding clauses, wherein the insulating layer is enriched with fillers and/or additives.

Clause 7: The method according to any of the preceding clauses, wherein the insulating layer is hardened after printing.

Clause 8: The method according to any of the preceding clauses, wherein the insulating layer is cross-linked and/or hardened by means of actinic radiation, chemical reaction, heat or drying after printing.

Clause 9: The method according to any of the preceding clauses, wherein the insulating layer is applied such that it levels out or smoothes the topography of a surface.

Clause 10: The method according to any of the preceding clauses, wherein the insulating layer is applied such that specific regions remain free of said layer.

Clause 11: The method according to any of the preceding clauses, wherein the surfaces remaining free are produced by the applied material not being cross-linked or being selectively removed again at these points.

Clause 12: The method according to any of the preceding clauses, wherein the electrically conductive material is applied by means of printing methods.

Clause 13: The method according to any of the preceding clauses, wherein the electrically conductive material is made of a metallically filled or enriched liquid.

Clause 14: The method according to any of the preceding clauses, the metallically filled or enriched liquid being cross-linked, dried or hardened by means of heat, light or lasers and having an electrically conductive function.

Clause 15: The method according to any of the preceding clauses, the metallically filled or enriched liquid being applied to the surfaces omitted by the insulating layer or to free surfaces and/or being embedded in the insulating layer.

Clause 16: The method according to any of the preceding clauses, the printing method applying the metallically filled or enriched liquid so that by printing a number of times a three-dimensional structure is produced which after cross-linking, drying, fusing or sintering makes it possible to produce wiring selectively—even multi-layered—even crossing—even merging—from the conductive component in three-dimensional alignment.

Clause 17: The method according to any of the preceding clauses, the conductive component and the insulating component being produced simultaneously, one after the other or in a specific sequence so as to produce a three-dimensional layer here which has dielectric properties, but has selectively metallic structures in the form of conductor paths in order to make possible and to guide electric contacts.

Clause 18: The method according to any of the preceding clauses, by means of the vertical structure the conductive component constituting a metallic contact projecting out of the interposer and which fulfils the function of a bump and which should enable easier contacting.

Clause 19: The method according to any of the preceding clauses, the contact projecting out being able to be covered by a second conductive component.

Clause 20: The method according to any of the preceding claims, the dielectric component protecting the contacts from the conductive component guided within it or to the outside from undesired contacts.

Clause 21: The method according to any of the preceding clauses, the interposer being applied to a wafer and/or chip, and being used for electrical contacting or rewiring between wafers and/or chips and/or sensors and/or MEMS.

Clause 22: The method according to any of the preceding clauses, a chip and/or a wafer being optically recognised and mechanically aligned before applying the interposer.

Clause 23: The method according to any of the preceding clauses, an electrical component being applied when producing the interposer by means of a printing method.

Clause 24: The method according to any of the preceding clauses, a passive electrical component being applied when producing the interposer by means of placing and/or printing.

Clause 25: The method according to any of the preceding clauses, when producing the interposer a contact being produced which can be contacted on the side of the interposer.

Clause 26: The method according to any of the preceding clauses, the interposer first of all being printed on a surface which is neither a wafer nor a chip, and only being introduced between the wafer and/or the chip after it has been completed.

Clause 27: The method according to any of the preceding clauses, the interposer selectively having good thermal conductivity.

Clause 28: The method according to any of the preceding clauses, the interposer being used for heat dissipation and/or being thermally contactable.

Clause 29: The method according to any of the preceding clauses, the conductive component also being applied by means of imprinting.

Clause 30: A device for implementing the method according to any of the preceding clauses and which has at least two print heads.

Clause 31: The device according to any of the preceding clauses, having one or a number of apparatuses for optically recognising, aligning wafers and/or chips and for printing, cross-linking, drying, sintering or fusing the applied components.

LIST OF REFERENCE NUMBERS 10 semi-conductor module
12 semi-conductor chip
13 upper side
14 semi-conductor chip
16 semi-conductor chip
18 semi-conductor chip
20 interposer
22 interposer
24 interposer
26 metallic contact surface
28 electrically conductive structures
30 electrically insulating material 31 electrically insulating layer
32 filled via
33 metallic elevation
24 contact metal
36 bonding wire
38 passivation layer
40 opening
42 conductor path
50 system for producing a semi-conductor module
52 wafer holding device
54 wafer
56 wafer aligner
58 first printing unit
60 print mask
61 displacing device
62 radiation source
64 second printing unit
66 nozzle
67 displacing device
68 electrically conductive ink
70 laser
71 displacing device
72 mounting device
74 chip holding apparatus
76 chip placing apparatus

The invention claimed is:

1. A method of producing a semi-conductor module comprising at least two semi-conductor chips and an interposer comprising electrically conductive structures, the interposer connecting each of the at least two semi-conductor chips to one another, comprising the steps of:
(a) first printing the interposer directly onto a first of the semi-conductor chips, wherein said first printing comprises
(i) second printing of a first electrically insulating layer with openings directly onto the first semi-conductor chip by screen printing, and
(ii) producing the electrically conductive structures by an electrically conductive ink, comprising filling the openings with a first portion of the electrically conductive ink and then producing first conductor paths by applying a second portion of the electrically conductive ink to the first electrically insulating layer, the first and second portions of electrically conductive ink respectively being discharged by aerosol jet printing comprising application by a continuous jet, and
(b) mounting a second of the at least two semi-conductor chips on the interposer such that the two semi-conductor chips are arranged one above the other and that the interposer forms an intermediate layer between the two semi-conductor chips;
wherein at least one of the semiconductor chips comprises a through-chip via, and wherein the through-chip via is electrically coupled to a conductive portion of the interposer.

2. The method according to claim 1, wherein the first semi-conductor chip is part of a wafer when printing on the interposer.

3. The method according to claim 1, wherein the wafer is tested with regard to faulty regions before the interposer is printed on, and upon the basis of the test result the layout of the electrically conductive structures to be printed on is configured to maintain the faulty regions in the semi-conductor module while avoiding electrically conductive contact of the interposer with the faulty regions.

4. A method for producing a semi-conductor module comprising at least two semi-conductor chips and an interposer comprising electrically conductive structures connecting the semi-conductor chips to one another, comprising the steps wherein:
the interposer is printed directly onto a first of the semi-conductor chips,
when printing on the interposer the electrically conductive structures are produced by means of electrically conductive ink,
the second semi-conductor chip is mounted on the interposer such that the two semi-conductor chips are arranged one over the other and the interposer forms an intermediate layer between the two semi-conductor chips, and
the first semi-conductor chip is part of a wafer when printing on the interposer, and the wafer is tested with regard to faulty regions before the interposer is printed on, and upon the basis of the test result the layout of the conductive structures to be printed on is configured to maintain the faulty regions in the semi-conductor module while avoiding electrically conductive contact of the interposer with the faulty regions.

5. The method according to claim 4, wherein when testing the wafer with regard to faulty regions the first semi-conductor chip is tested with regard to its electrical properties.

6. The method according to claim 4, wherein the electrically conductive structures are produced by means of an aerosol jet printing method.

7. The method according to claim 1, wherein the electrically conductive ink comprises metallic particles with a maximum dimension of at most 20 nm.

8. The method according to claim 1, wherein the electrically conductive ink comprises silver, gold and/or copper particles.

9. The method according to claim 1, wherein the electrically conductive ink comprises metallic particles which connect to one another at a temperature of below 200° C.

10. The method according to claim 1, wherein the electrically conductive ink comprises metallic particles which connect to one another when irradiated with light having a wavelength of less than 600 nm.

11. The method according to claim 2, wherein the wafer is diced after printing on the interposer.

12. The method according to claim 10, wherein the wafer is diced after printing on the interposer.

13. The method according to claim 4, wherein the electrically conductive ink comprises metallic particles with a maximum dimension of at most 20 nm.

14. The method according to claim 4, wherein the electrically conductive ink comprises silver, gold and/or copper particles.

15. The method according to claim 4, wherein the electrically conductive ink comprises metallic particles which connect to one another at a temperature of below 200° C.

16. The method according to claim 4, wherein the electrically conductive ink comprises metallic particles which connect to one another when irradiated with light having a wavelength of less than 600 nm.

17. The method according to claim 16, wherein the wafer is diced after printing on the interposer.

18. A method of producing a semi-conductor module comprising at least two semi-conductor chips and an interposer comprising electrically conductive structures, the interposer connecting each of the at least two semi-conductor chips to one another, comprising the steps of:
(a) first printing the interposer directly onto a first of the semi-conductor chips, wherein said first printing comprises (i) second printing of a first electrically insulating layer with openings directly onto the first semi-conductor chip, and (ii) producing the electrically conductive structures by an electrically conductive ink, comprising filling the openings with a first portion of the electrically conductive ink and then producing first conductor paths by applying a second portion of the electrically conductive ink to the first electrically insulating layer, the first and second portions of electrically conductive ink respectively being discharged by aerosol jet printing comprising application by a continuous jet, and (b) mounting a second of the at least two semi-conductor chips on the interposer such that the two semi-conductor chips are arranged one above the other and that the interposer forms an intermediate layer between the two semi-conductor chips;

wherein at least one of the semiconductor chips comprises a through-chip via, and wherein the through-chip via is electrically coupled to a conductive portion of the interposer.

19. The method of claim 1, wherein the interposer comprises multiple layers of electrically conductive structures, and wherein the method further comprises the step of:

(a)(iii) producing further electrically conductive structures of second conductor paths by adding a second electrically insulating layer to electrically insulate the second conductor paths from the first conductor paths, and producing second conductor paths by applying a further portion of electrically conductive ink to the second electrically insulating layer, thereby generating the interposer comprising multiple layers of electrically conductive structures.

20. The method of claim 18, wherein the interposer comprises multiple layers of electrically conductive structures, and wherein the method further comprises the step of:

(a)(iii) producing further electrically conductive structures of second conductor paths by adding a second electrically insulating layer to electrically insulate the second conductor paths from the first conductor paths, and producing second conductor paths by applying a further portion of electrically conductive ink to the second electrically insulating layer, thereby generating the interposer comprising multiple layers of electrically conductive structures.

21. The method of claim 19, wherein the first and second conductor paths cross while remaining electrically insulated from one another.

22. The method of claim 21, wherein the first and second conductor paths cross while remaining electrically insulated from one another.

* * * * *